(12) United States Patent
Chiu et al.

(10) Patent No.: US 8,022,511 B2
(45) Date of Patent: Sep. 20, 2011

(54) SEMICONDUCTOR DEVICE PACKAGES WITH ELECTROMAGNETIC INTERFERENCE SHIELDING

(75) Inventors: Chi-Tsung Chiu, Kaohsiung (TW); Chih-Pin Hung, Kaohsiung (TW); Jui-Cheng Huang, Pingtung County (TW)

(73) Assignee: Advanced Semiconductor Engineering, Inc., Kaosiung (TW)

( * ) Notice: Subject to any disclaimer, the term of this patent is extended or adjusted under 35 U.S.C. 154(b) by 0 days.

(21) Appl. No.: 12/336,407

(22) Filed: Dec. 16, 2008

(65) Prior Publication Data
US 2009/0194852 A1   Aug. 6, 2009

Related U.S. Application Data

(60) Provisional application No. 61/006,893, filed on Feb. 5, 2008.

(30) Foreign Application Priority Data

Apr. 30, 2008   (TW) .............................. 97115986 A

(51) Int. Cl.
*H01L 23/552* (2006.01)
(52) U.S. Cl. ................. 257/659; 257/E23.114
(58) Field of Classification Search .................. 257/659, 257/E23.114; 438/121
See application file for complete search history.

(56) References Cited

U.S. PATENT DOCUMENTS

| | | | |
|---|---|---|---|
| 3,390,226 A | 6/1968 | Beyerlein | |
| 4,569,786 A | 2/1986 | Deguchi | |
| 4,717,948 A | 1/1988 | Sakai et al. | |
| 4,814,205 A | 3/1989 | Arcilesi et al. | |
| 4,821,007 A | 4/1989 | Fields et al. | |
| 5,140,745 A | 8/1992 | McKenzie | |
| 5,166,772 A | 11/1992 | Soldner et al. | |
| 5,172,077 A | 12/1992 | Funada | |

(Continued)

FOREIGN PATENT DOCUMENTS

CN   1442033 A   9/2003
(Continued)

OTHER PUBLICATIONS

Chiu et al. "Semiconductor Device Packages With Electromagnetic Interference Shielding" U.S. Appl. No. 12/336,400, filed Dec. 16, 2008. Office Actions mailed Oct. 29, 2009, Apr. 12, 2010, Jun. 29, 2010.

(Continued)

*Primary Examiner* — Zandra Smith
*Assistant Examiner* — Paul E Patton
(74) *Attorney, Agent, or Firm* — Cooley LLP

(57) ABSTRACT

Described herein are semiconductor device packages with EMI shielding and related methods. In one embodiment, a semiconductor device package includes: (1) a substrate unit; (2) a grounding element disposed adjacent to a periphery of the substrate unit and extending upwardly from an upper surface of the substrate unit; (3) a semiconductor device disposed adjacent to the upper surface; (4) a package body disposed adjacent to the upper surface and covering the semiconductor device and the grounding element; and (5) an EMI shield disposed adjacent to exterior surfaces of the package body and electrically connected to a lateral surface of the grounding element. A lateral surface of the package body is substantially aligned with a lateral surface of the substrate unit. The grounding element corresponds to a remnant of a conductive bump, and provides an electrical pathway to ground electromagnetic emissions incident upon the EMI shield.

21 Claims, 8 Drawing Sheets

U.S. PATENT DOCUMENTS

| | | | |
|---|---|---|---|
| 5,353,498 A | 10/1994 | Fillion et al. | |
| 5,355,016 A | 10/1994 | Swirbel et al. | |
| 5,557,142 A | 9/1996 | Gilmore et al. | |
| 5,600,181 A | 2/1997 | Scott et al. | |
| 5,639,989 A | 6/1997 | Higgins, III | |
| 5,677,511 A | 10/1997 | Taylor et al. | |
| 5,694,300 A | 12/1997 | Mattei et al. | |
| 5,703,761 A | 12/1997 | Heiss | |
| 5,726,612 A | 3/1998 | Mandai | |
| 5,729,437 A | 3/1998 | Hashimoto | |
| 5,776,798 A | 7/1998 | Quan et al. | |
| 5,847,930 A | 12/1998 | Kazle | |
| 5,864,088 A | 1/1999 | Sato et al. | |
| 5,886,876 A | 3/1999 | Yamaguchi | |
| 5,895,229 A | 4/1999 | Carney et al. | |
| 5,898,344 A | 4/1999 | Hayashi | |
| 5,966,052 A | 10/1999 | Sakai | |
| 5,977,626 A | 11/1999 | Wang et al. | |
| 5,998,867 A | 12/1999 | Jensen et al. | |
| 6,079,099 A | 6/2000 | Uchida et al. | |
| 6,093,972 A | 7/2000 | Carney et al. | |
| 6,150,193 A | 11/2000 | Glenn | |
| 6,194,250 B1 | 2/2001 | Melton et al. | |
| 6,225,694 B1 * | 5/2001 | Terui | 257/704 |
| 6,255,143 B1 | 7/2001 | Briar | |
| 6,261,680 B1 | 7/2001 | Denman | |
| 6,369,335 B1 | 4/2002 | Wajima | |
| 6,376,769 B1 | 4/2002 | Chung | |
| 6,448,632 B1 | 9/2002 | Takiar et al. | |
| 6,455,864 B1 | 9/2002 | Featherby et al. | |
| 6,472,598 B1 | 10/2002 | Glenn | |
| 6,472,743 B2 | 10/2002 | Huang et al. | |
| 6,479,903 B2 | 11/2002 | Briar | |
| 6,492,194 B1 | 12/2002 | Bereau et al. | |
| 6,521,978 B2 | 2/2003 | Fenk et al. | |
| 6,566,596 B1 | 5/2003 | Askew | |
| 6,586,822 B1 | 7/2003 | Vu et al. | |
| 6,602,737 B2 | 8/2003 | Wu | |
| 6,614,102 B1 | 9/2003 | Hoffman et al. | |
| 6,635,953 B2 | 10/2003 | Wu | |
| 6,686,649 B1 | 2/2004 | Matthews et al. | |
| 6,695,985 B2 | 2/2004 | Igarashi et al. | |
| 6,740,546 B2 | 5/2004 | Corisis et al. | |
| 6,740,959 B2 | 5/2004 | Alcoe et al. | |
| 6,757,181 B1 | 6/2004 | Villanueva | |
| 6,781,231 B2 | 8/2004 | Minervini | |
| 6,800,804 B2 | 10/2004 | Igarashi et al. | |
| 6,838,776 B2 | 1/2005 | Leal et al. | |
| 6,856,007 B2 | 2/2005 | Warner | |
| 6,865,084 B2 | 3/2005 | Lin et al. | |
| 6,867,480 B2 | 3/2005 | Legaspi, Jr. et al. | |
| 6,881,896 B2 | 4/2005 | Ebihara | |
| 6,900,383 B2 | 5/2005 | Babb et al. | |
| 6,928,719 B2 | 8/2005 | Kim et al. | |
| 6,962,869 B1 | 11/2005 | Bao et al. | |
| 6,967,403 B2 | 11/2005 | Chuang et al. | |
| 6,975,516 B2 | 12/2005 | Asahi et al. | |
| 6,992,400 B2 | 1/2006 | Tikka et al. | |
| 6,998,532 B2 | 2/2006 | Kawamoto et al. | |
| 7,030,469 B2 * | 4/2006 | Mahadevan et al. | 257/659 |
| 7,045,385 B2 | 5/2006 | Kim et al. | |
| 7,049,682 B1 | 5/2006 | Mathews et al. | |
| 7,081,661 B2 | 7/2006 | Takehara et al. | |
| 7,125,744 B2 | 10/2006 | Takehara et al. | |
| 7,161,252 B2 | 1/2007 | Tsuneoka et al. | |
| 7,180,012 B2 * | 2/2007 | Tsuneoka et al. | 174/521 |
| 7,183,498 B2 | 2/2007 | Ogura et al. | |
| 7,186,928 B2 * | 3/2007 | Kikuchi et al. | 174/350 |
| 7,187,060 B2 | 3/2007 | Usui | |
| 7,294,587 B2 | 11/2007 | Asahi et al. | |
| 7,327,015 B2 | 2/2008 | Yang et al. | |
| 7,342,303 B1 | 3/2008 | Berry et al. | |
| 7,372,151 B1 | 5/2008 | Fan et al. | |
| 7,445,968 B2 | 11/2008 | Harrison et al. | |
| 7,446,265 B2 | 11/2008 | Krohto et al. | |
| 7,451,539 B2 | 11/2008 | Morris et al. | |
| 7,478,474 B2 | 1/2009 | Koga | |
| 7,488,903 B2 | 2/2009 | Kawagishi et al. | |
| 7,576,415 B2 | 8/2009 | Cha et al. | |
| 7,629,674 B1 | 12/2009 | Foster | |
| 7,633,170 B2 | 12/2009 | Yang et al. | |
| 7,633,765 B1 | 12/2009 | Scanlan et al. | |
| 7,656,047 B2 | 2/2010 | Yang et al. | |
| 7,700,411 B2 | 4/2010 | Yang et al. | |
| 7,745,910 B1 | 6/2010 | Olson et al. | |
| 7,772,046 B2 * | 8/2010 | Pagaila et al. | 438/127 |
| 7,829,981 B2 | 11/2010 | Hsu | |
| 2002/0053724 A1 | 5/2002 | Lai et al. | |
| 2002/0093108 A1 | 7/2002 | Grigorov | |
| 2004/0020673 A1 | 2/2004 | Mazurkiewicz | |
| 2004/0063242 A1 | 4/2004 | Kamezos | |
| 2004/0150097 A1 | 8/2004 | Gaynes et al. | |
| 2004/0178500 A1 | 9/2004 | Usui | |
| 2004/0231872 A1 | 11/2004 | Arnold et al. | |
| 2004/0252475 A1 | 12/2004 | Tsuneoka et al. | |
| 2005/0013082 A1 | 1/2005 | Kawamoto et al. | |
| 2005/0029673 A1 | 2/2005 | Naka et al. | |
| 2005/0039946 A1 | 2/2005 | Nakao | |
| 2005/0045358 A1 | 3/2005 | Arnold | |
| 2005/0208702 A1 | 9/2005 | Kim | |
| 2006/0145361 A1 | 7/2006 | Yang et al. | |
| 2006/0148317 A1 | 7/2006 | Akaike et al. | |
| 2006/0160261 A1 | 7/2006 | Sheats et al. | |
| 2006/0266547 A1 | 11/2006 | Koga | |
| 2008/0042301 A1 | 2/2008 | Yang et al. | |
| 2008/0061407 A1 | 3/2008 | Yang et al. | |
| 2008/0128890 A1 | 6/2008 | Choi et al. | |
| 2008/0174013 A1 | 7/2008 | Yang et al. | |
| 2009/0000114 A1 | 1/2009 | Rao et al. | |
| 2009/0000815 A1 | 1/2009 | Hiner et al. | |
| 2009/0000816 A1 | 1/2009 | Hiner et al. | |
| 2009/0002969 A1 | 1/2009 | Madsen et al. | |
| 2009/0002970 A1 | 1/2009 | Leahy et al. | |
| 2009/0002971 A1 | 1/2009 | Carey et al. | |
| 2009/0002972 A1 | 1/2009 | Carey et al. | |
| 2009/0025211 A1 | 1/2009 | Hiner et al. | |
| 2009/0035895 A1 | 2/2009 | Lee et al. | |
| 2009/0075428 A1 | 3/2009 | Tang et al. | |
| 2009/0102003 A1 | 4/2009 | Vogt et al. | |
| 2009/0102033 A1 | 4/2009 | Raben | |
| 2009/0194851 A1 | 8/2009 | Chiu et al. | |
| 2009/0230487 A1 | 9/2009 | Saitoh et al. | |
| 2009/0230523 A1 | 9/2009 | Chien et al. | |
| 2009/0230524 A1 | 9/2009 | Chien et al. | |
| 2009/0230525 A1 | 9/2009 | Chien et al. | |
| 2009/0230526 A1 | 9/2009 | Chen et al. | |
| 2009/0236700 A1 * | 9/2009 | Moriya | 257/659 |
| 2009/0256244 A1 | 10/2009 | Liao et al. | |
| 2009/0261470 A1 | 10/2009 | Choi et al. | |
| 2009/0294928 A1 | 12/2009 | Kim et al. | |
| 2010/0006330 A1 | 1/2010 | Fu et al. | |
| 2010/0013064 A1 | 1/2010 | Hsu | |
| 2010/0032815 A1 | 2/2010 | An et al. | |
| 2010/0109132 A1 | 5/2010 | Ko et al. | |
| 2010/0110656 A1 | 5/2010 | Ko et al. | |
| 2010/0207257 A1 | 8/2010 | Lee | |
| 2010/0207258 A1 | 8/2010 | Eun et al. | |
| 2010/0207259 A1 | 8/2010 | Liao et al. | |
| 2011/0006408 A1 | 1/2011 | Liao | |

FOREIGN PATENT DOCUMENTS

| | | |
|---|---|---|
| CN | 1774804 A | 5/2006 |
| JP | 55044737 | 3/1980 |
| JP | 58122759 | 7/1983 |
| JP | 59051555 | 3/1984 |
| JP | 63262860 | 10/1988 |
| JP | 64037043 | 2/1989 |
| JP | 64064298 | 3/1989 |
| JP | 02078299 | 3/1990 |
| JP | 03023654 | 1/1991 |
| JP | 03171652 | 7/1991 |
| JP | 04147652 | 5/1992 |
| JP | 04206858 | 7/1992 |
| JP | 05129476 | 5/1993 |

| | | |
|---|---|---|
| JP | 08-288686 | 1/1996 |
| JP | 08288686 | 11/1996 |
| JP | 2003273571 | 9/2003 |
| WO | WO 2004/060034 A1 | 7/2004 |
| WO | WO 2006076613 | 7/2006 |

OTHER PUBLICATIONS

Lee et al. "Semiconductor Device Packages With Electromagnetic Interference Shielding." U.S. Appl. No. 12/622,419, filed Nov. 19. 2009.

Kim et al. "Semiconductor Device Packages With Electromagnetic Interference Shielding," U.S. Appl. No. 12/622,415, filed Nov. 19, 2009.

Liao et al. "Semiconductor Device Packages With Electromagnetic Interference Shielding." U.S. Appl. No. 12/489,115, filed Jun. 22, 2009. Office Actions mailed Nov. 12, 2009, Apr. 9, 2010, Jun. 29, 2010; Notice of Allowance mailed Oct. 25, 2010.

Chiu et al. "Wafer-Level Semiconductor Device Packages With Electromagnetic Interference Shielding." U.S. Appl. No. 12/622,393, filed Nov. 19, 2009.

Weng et al., "Semiconductor Package and Manufacturing Methods Thereof." U.S. Appl. No. 12/955,782, filed Nov. 29, 2010.

Liao et al. "Semiconductor Device Packages With Electromagnetic Interference Shielding" U.S. Appl. No. 12/489,115, filed Jun. 22, 2009. Notice of Allowance mailed Mar. 10, 2011.

* cited by examiner

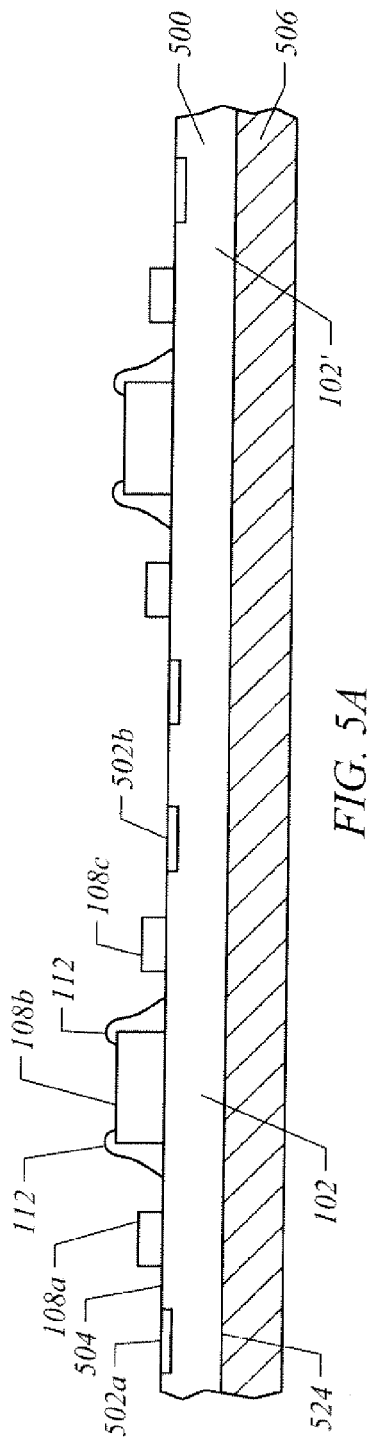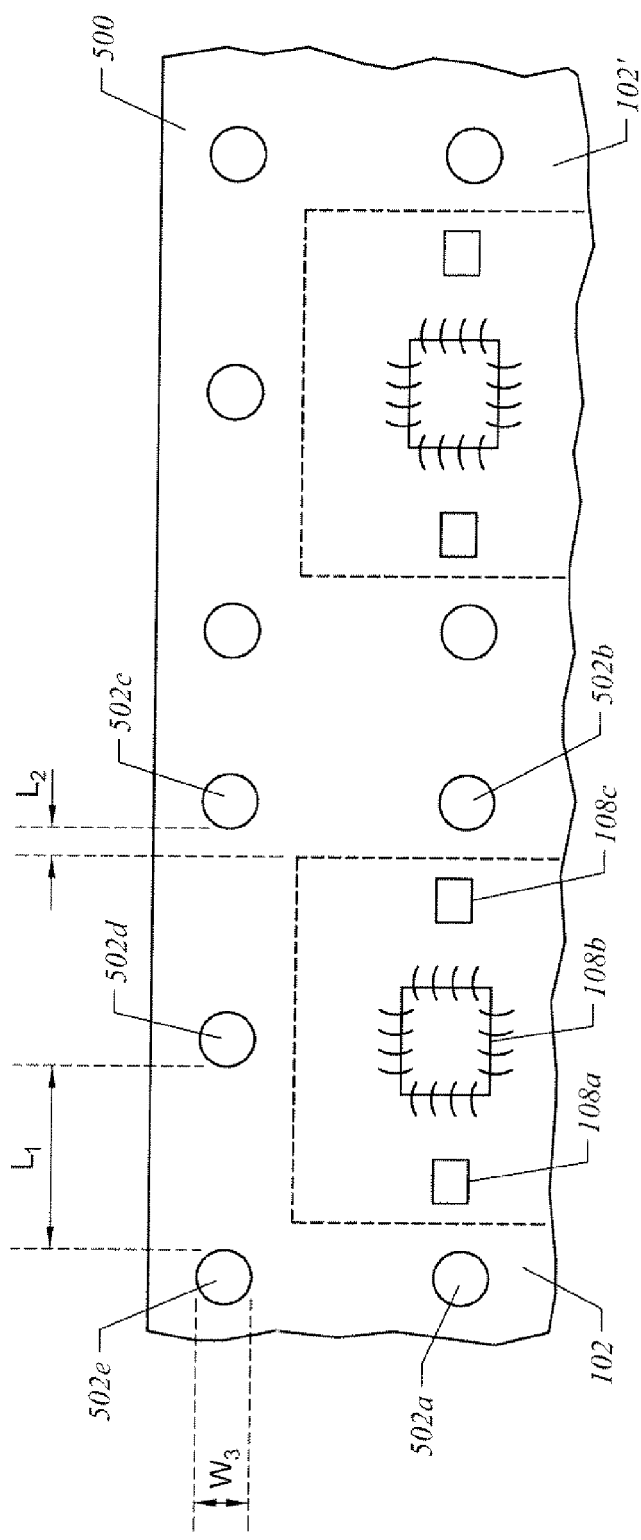

SEMICONDUCTOR DEVICE PACKAGES WITH ELECTROMAGNETIC INTERFERENCE SHIELDING

CROSS REFERENCE TO RELATED APPLICATIONS

This application claims the benefit of U.S. Provisional Application Ser. No. 61/006,893, filed on Feb. 5, 2008, and the benefit of Taiwan Application Serial No. 97115986, filed on Apr. 30, 2008, the disclosures of which are incorporated herein by reference in their entireties.

FIELD OF THE INVENTION

The invention relates generally to semiconductor device packages. More particularly, the invention relates to semiconductor device packages with electromagnetic interference shielding.

BACKGROUND

Semiconductor devices have become progressively more complex, driven at least in part by the demand for enhanced processing speeds and smaller sizes. While the benefits of enhanced processing speeds and smaller sizes are apparent, these characteristics of semiconductor devices also can create problems. In particular, higher clock speeds can involve more frequent transitions between signal levels, which, in turn, can lead to a higher level of electromagnetic emissions at higher frequencies or shorter wavelengths. Electromagnetic emissions can radiate from a source semiconductor device, and can be incident upon neighboring semiconductor devices. If the level of electromagnetic emissions at a neighboring semiconductor device is sufficiently high, these emissions can adversely affect the operation of that semiconductor device. This phenomenon is sometimes referred to as electromagnetic interference ("EMI"). Smaller sizes of semiconductor devices can exacerbate EMI by providing a higher density of those semiconductor devices within an overall electronic system, and, thus, a higher level of undesired electromagnetic emissions at a neighboring semiconductor device.

One way to reduce EMI is to shield a set of semiconductor devices within a semiconductor device package. In particular, shielding can be accomplished by including an electrically conductive casing or housing that is electrically grounded and is secured to an exterior of the package. When electromagnetic emissions from an interior of the package strike an inner surface of the casing, at least a portion of these emissions can be electrically shorted, thereby reducing the level of emissions that can pass through the casing and adversely affect neighboring semiconductor devices. Similarly, when electromagnetic emissions from a neighboring semiconductor device strike an outer surface of the casing, a similar electrical shorting can occur to reduce EMI of semiconductor devices within the package.

While an electrically conductive casing can reduce EMI, the use of the casing can suffer from a number of disadvantages. In particular, the casing is typically secured to an exterior of a semiconductor device package by an adhesive. Unfortunately, the casing can be prone to peeling or falling off, since binding characteristics of the adhesive can be adversely affected by temperature, humidity, and other environmental conditions. Also, when securing the casing to the package, the size and shape of the casing and the size and shape of the package should match within relatively small tolerance levels. This matching of sizes and shapes and associated precision in relative positioning, of the casing and the package can render manufacturing operations costly and time consuming. Because of this matching of sizes and shapes, it also follows that semiconductor device packages of different sizes and shapes can require different casings, which can further increase manufacturing cost and time to accommodate the different packages.

It is against this background that a need arose to develop the semiconductor device packages and related methods described herein.

SUMMARY

One aspect of the invention relates to semiconductor device packages with EMI shielding. In one embodiment, a semiconductor device package includes: (1) a substrate unit including an upper surface, a lower surface, and a lateral surface disposed adjacent to a periphery of the substrate unit; (2) a grounding element disposed adjacent to the periphery of the substrate unit and extending upwardly from the upper surface of the substrate unit; (3) a semiconductor device disposed adjacent to the upper surface of the substrate unit and electrically connected to the substrate unit; (4) a package body disposed adjacent to the upper surface of the substrate unit and covering the semiconductor device and the grounding element, such that a lateral surface of the grounding element is electrically exposed; and (5) an EMI shield disposed adjacent to exterior surfaces of the package body and electrically connected to the lateral surface of the grounding element. A lateral surface of the package body is substantially aligned with the lateral surface of the substrate unit. The grounding element corresponds to a remnant of a conductive bump, and provides an electrical pathway to ground electromagnetic emissions incident upon the EMI shield.

In another embodiment, the semiconductor device package includes: (1) a substrate unit including a first surface, a second opposing surface, and a grounding pad disposed adjacent to the first surface; (2) a grounding element extending upwardly from the grounding pad and electrically connected to the grounding pad; (3) a semiconductor device disposed adjacent to the first surface of the substrate unit and electrically connected to the substrate unit; (4) a package body disposed adjacent to the first surface of the substrate unit and covering the semiconductor device and the grounding element, such that a connection surface of the grounding element is electrically exposed; and (5) an EMI shield disposed adjacent to exterior surfaces of the package body and electrically connected to the connection surface of the grounding element. The connection surface of the grounding element is disposed adjacent to a periphery of the substrate unit, and the grounding element provides an electrical pathway to ground electromagnetic emissions incident upon the EMI shield.

Another aspect of the invention relates to methods of forming semiconductor device packages with EMI shielding. In one embodiment, a method includes: (1) providing a substrate including an upper surface, a lower surface, and contact pads disposed adjacent to the upper surface; (2) electrically connecting a semiconductor device to the upper surface of the substrate; (3) applying an electrically conductive material to the upper surface of the substrate to form conductive bumps disposed adjacent to respective ones of the contact pads; (4) applying a molding material to the upper surface of the substrate to form a molded structure covering the conductive bumps and the semiconductor device; (5) forming cutting slits extending through the molded structure and the substrate, and the cutting slits are aligned with the substrate, such that: (a) the substrate is sub-divided to form a substrate unit;

(b) the molded structure is sub-divided to for a package body disposed adjacent to the substrate unit; and (c) remnants of the conductive bumps correspond to grounding elements disposed adjacent to a periphery of the substrate unit; and (6) applying an EMI coating to exterior surfaces of the package body and exposed lateral surfaces of the grounding elements to form an EMI shield.

Other aspects and embodiments of the invention are also contemplated. The foregoing summary and the following detailed description are not meant to restrict the invention to any particular embodiment but are merely meant to describe some embodiments of the invention.

BRIEF DESCRIPTION OF THE DRAWINGS

For a better understanding of the nature and objects of some embodiments of the invention, reference should be made to the following detailed description taken in conjunction with the accompanying drawings. In the drawings, like reference numbers denote like elements, unless the context clearly dictates otherwise.

FIG. 5A through FIG. 5G illustrate a method of forming the semiconductor device package of FIG. 1, according to an embodiment of the invention.

DETAILED DESCRIPTION

Definitions

The following definitions apply to some of the aspects described with respect to some embodiments of the invention. These definitions may likewise be expanded upon herein.

As used herein, the singular terms "a," "an," and "the" include plural referents unless the context clearly dictates otherwise. Thus, for example, reference to a grounding element can include multiple grounding elements unless the context clearly dictates otherwise.

As used herein, the term "set" refers to a collection of one or more components. Thus, for example, a set of layers can include a single layer or multiple layers. Components of a set also can be referred to as members of the set. Components of a set can be the same or different. In some instances, components of a set can share one or more common characteristics.

As used herein, the term "adjacent" refers to being near or adjoining. Adjacent components can be spaced apart from one another or can be in actual or direct contact with one another. In some instances, adjacent components can be connected to one another or can be formed integrally with one another.

As used herein, the terms "upper," "upwardly," "lower." "downwardly," "lateral," and "laterally" refer to a relative orientation of a set of components, such as in accordance with the drawings, but do not require a particular orientation of those components during manufacturing or use.

As used herein, the terms "connect," "connected," and "connection" refer to an operational coupling or linking. Connected components can be directly coupled to one another or can be indirectly coupled to one another, such as via another set of components.

As used herein, the terms "substantially" and "substantial" refer to a considerable degree or extent. When used in conjunction with an event or circumstance, the terms can refer to instances in which the event or circumstance occurs precisely as well as instances in which the event or circumstance occurs to a close approximation, such as accounting for typical tolerance levels of the manufacturing operations described herein.

As used herein, the terms "electrically conductive" and "electrical conductivity" refer to an ability to transport an electric current. Electrically conductive materials typically correspond to those materials that exhibit little or no opposition to flow of an electric current. One measure of electrical conductivity is in teens of Siemens per meter ("S·min$^{-1}$"). Typically, an electrically conductive material is one having a conductivity greater than about $10^4$ S·m$^{-1}$, such as at least about $10^5$ S·m$^{-1}$ or at least about $10^6$ S·m$^{-1}$. Electrical conductivity of a material can sometimes vary with temperature. Unless otherwise specified, electrical conductivity of a material is defined at room temperature.

Figure 1:
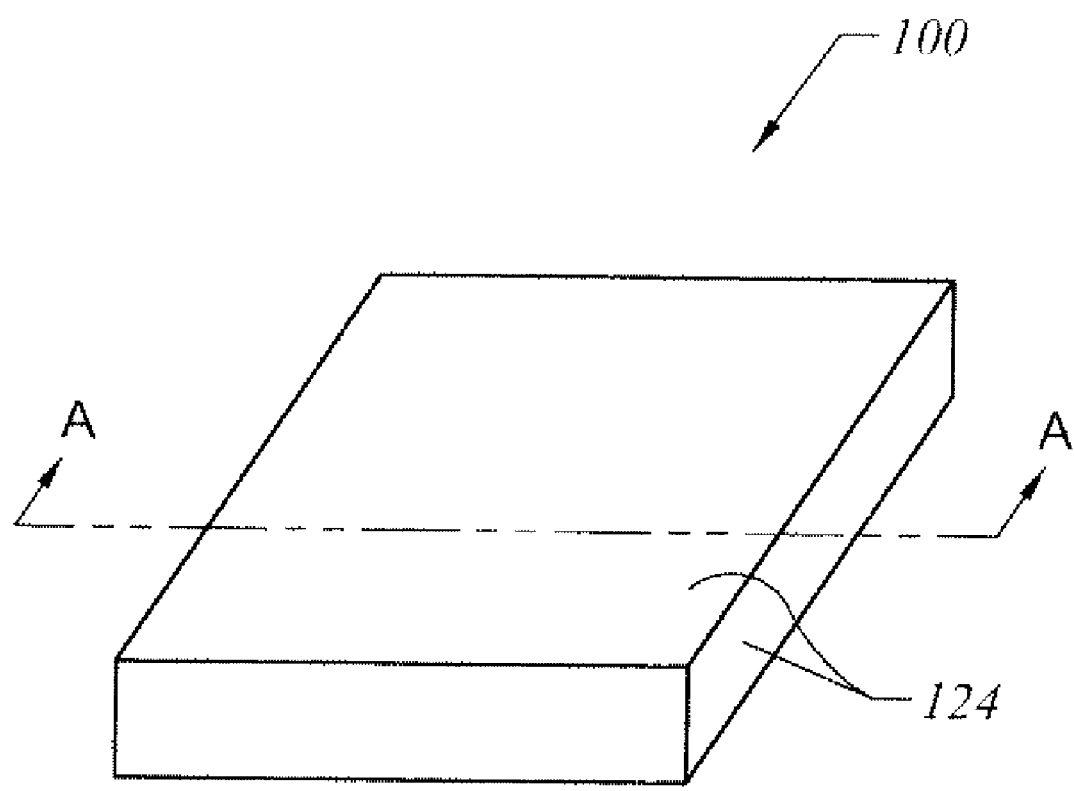
FIG. 1 illustrates a perspective view of a semiconductor device package implemented in accordance with an embodiment of the invention.
Figure 2:
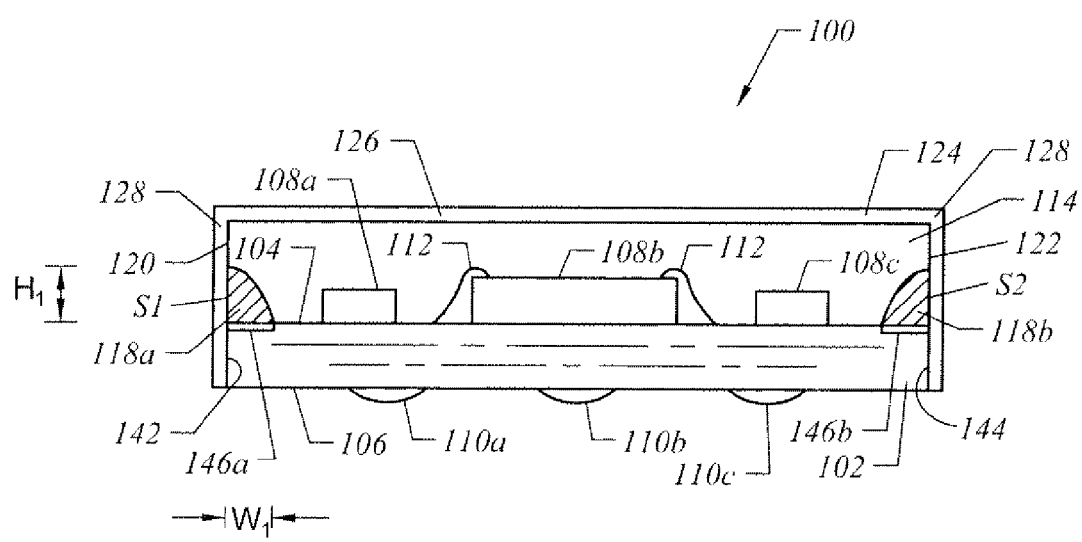
FIG. 2 illustrates a cross-sectional view of the semiconductor device package of FIG. 1, taken along line A-A of FIG. 1.

Attention first turns to FIG. 1 and FIG. 2, which illustrate a semiconductor device package 100 implemented in accordance with an embodiment of the invention. In particular; FIG. 1 illustrates a perspective view of the package 100, while FIG. 2 illustrates a cross-sectional view of the package 100, taken along line A-A of FIG. 1.

In the illustrated embodiment, sides of the package 100 are substantially planar and have a substantially orthogonal orientation so as to define a lateral profile that extends around substantially an entire periphery of the package 100. Advantageously, this orthogonal lateral profile allows a reduced overall package size by reducing or minimizing a footprint area of the package 100. However, it is contemplated that the lateral profile of the package 100, in general, can be any of a number of shapes, such as curved, inclined, stepped, or roughly textured.

Referring to FIG. 2, the package 100 includes a substrate unit 102, which includes an upper surface 104, a lower surface 106; and lateral surfaces 142 and 144 disposed adjacent to sides of the substrate unit 102. In the illustrated embodiment, the lateral surfaces 142 and 144 are substantially planar and have a substantially orthogonal orientation with respect to the upper surface 104 or the lower surface 106, although it is contemplated that the shapes and orientations of the lateral surfaces 142 and 144 can vary for other implementations. For certain implementations, a thickness of the substrate unit 102, namely a distance between the upper surface 104 and the lower surface 106, can be in the range of about 0.1 millimeter ("mm") to about 2 mm, such as from about 0.2 mm to about 1.5 mm or from about 0.4 mm to about 0.6 mm.

The substrate unit 102 includes electrical interconnect to provide electrical pathways between the upper surface 104 and the lower surface 106. As illustrated in FIG. 2; grounding pads 146a and 146b are disposed adjacent to the upper surface 104 and adjacent to a periphery of the substrate unit 102. As further described below, the grounding pads 146a and 146b are implemented as contact pads and, more particularly, as remnants of contact pads in accordance with a set of singulation operations. The grounding pads 146a and 146b are connected to other electrical interconnect included in the substrate unit 102, such as a set of electrically conductive layers that are incorporated within a set of dielectric layers.

The electrically conductive layers can be connected to one another by internal vias, and can be implemented so as to sandwich a core formed from a suitable resin, such as one based on bismaleimide and triazine or based on epoxy and polyphenylene oxide. For example, the substrate unit 102 can include a substantially slab-shaped core that is sandwiched by one set of electrically conductive layers disposed adjacent to an upper surface of the core and another set of electrically conductive layers disposed adjacent to a lower surface of the core. While not illustrated in FIG. 2, it is contemplated that a solder mask layer can be disposed adjacent to either, or both, the upper surface 104 and the lower surface 106 of the substrate unit 102.

As illustrated in FIG. 2, the package 100 also includes grounding elements 118a and 118b that are disposed adjacent to the upper surface 104 and adjacent to the periphery of the substrate unit 102. The grounding elements 118a and 118b are electrically connected to and extend upwardly from respective ones of the grounding pads 146a and 146b and, as further described below, provide electrical pathways to reduce EMI. In the illustrated embodiment, the grounding elements 118a and 118b are implemented as conductive bumps and, more particularly, as remnants of conductive bumps in accordance with a set of singulation operations as further described below.

Still referring to FIG. 2, the grounding elements 118a and 118b include connection surfaces S1 and S2, respectively, which are lateral surfaces that face away from an interior of the package 100 and are electrically exposed at the periphery of the substrate unit 102. As illustrated in FIG. 29 the connection surfaces S1 and S2 are substantially planar and have a substantially orthogonal orientation with respect to the upper surface 104 or the lower surface 106, although it is contemplated that the connection surfaces S1 and S2 can be curved, inclined, or roughly textured for other implementations. Also, the connection surfaces S1 and S2 are substantially aligned or co-planar with the lateral surfaces 142 and 144, respectively. The grounding elements 118a and 118b are formed from a metal, a metal alloy, a matrix with a metal or a metal alloy dispersed therein or another suitable electrically conductive material. For certain implementations, a height $H_1$ of the grounding elements 118a and 118b can be in the range of about 200 micrometer ("µm") to about 600 µm, such as from about 250 µm to about 550 µm or from about 300 µm to about 500 µm, and a width $W_1$ of the grounding elements 118a and 118b can be in the range of about 100 µm to about 300 µm, such as from about 125 µm to about 275 µm or from about 150 µm to about 250 µm. An area of each of the connection surfaces S1 and S2 can be in the range of about 0.03 $mm^2$ to about 0.3 $mm^2$, such as from about 0.05 $mm^2$ to about 0.25 $mm^2$ or from about 0.07 $mm^2$ to about 0.2 $mm^2$. Advantageously, the relatively large areas of the connection surfaces S1 and S2 can enhance reliability and efficiency of electrical connections for reducing EMI.

As illustrated in FIG. 2, the package 100 also includes semiconductor devices 108a, 108b, and 108c, which are disposed adjacent to the upper surface 104 of the substrate unit 102, and electrical contacts 110a, 110b and 110c, which are disposed adjacent to the lower surface 106 of the substrate unit 102. The semiconductor device 108b is wire-bonded to the substrate unit 102 via a set of wires 112, which are formed from gold or another suitable electrically conductive material, and the semiconductor devices 108a and 108c are surface mounted to the substrate unit 102. In the illustrated embodiment, the semiconductor device 108b is a semiconductor chip, while the semiconductor devices 108a and 108c are passive devices, such as resistors, capacitors, or inductors.

The electrical contacts 110a, 1110b, and 110c provide input and output electrical connections for the package 100, and at least a subset of the electrical contact, 110a, 110b, and 110c are electrically connected to the semiconductor devices 108a, 108b, and 108c via electrical interconnect included in the substrate unit 102. In the illustrated embodiment, at least one of the electrical contacts 110a, 110b, and 110c is a ground electrical contact, and is electrically connected to the grounding elements 118a and 118b via electrical interconnect included in the substrate unit 102. While three semiconductor devices are illustrated in FIG. 2, it is contemplated that more or less semiconductor devices can be included for other implementations, and that semiconductor devices, in general, can be any active devices, any passive devices, or combinations thereof. It is also contemplated that the number of electrical contacts can vary from that illustrated in FIG. 2.

Still referring to FIG. 2, the package 100 also includes a package body 114 that is disposed adjacent to the upper surface 104 of the substrate unit 102. In conjunction with the substrate unit 102, the package body 114 substantially covers or encapsulates the grounding elements 118a and 118b, the semiconductor devices 108a, 108b, and 108c, and the wires 112 to provide mechanical stability as well as protection against oxidation, humidity, and other environmental conditions. The package body 114 is formed from a molding material, and includes exterior surfaces, including lateral surfaces 120 and 122 disposed adjacent to sides of the package body 114. In the illustrated embodiment, the lateral surfaces 120 and 122 are substantially planar and have a substantially orthogonal orientation with respect to the upper surface 104 or the lower surface 106, although it is contemplated that the lateral surfaces 120 and 122 can be curved, inclined, or roughly textured for other implementations. Also, the lateral surfaces 120 and 122 are substantially aligned or co-planar with the lateral surfaces 142 and 144, respectively, and also are substantially aligned or co-planar with the connection surfaces S1 and S2, respectively. More particularly, this alignment is accomplished while allowing the connection surfaces S1 and S2 to be electrically exposed, such as by reducing or minimizing coverage of the connection surfaces S1 and S2 by the package body 114. For other implementations, it is contemplated that the shape of the lateral surfaces 120 and 122 and their alignment with the connection surfaces S1 and S2 can be varied from that illustrated in FIG. 2, while allowing the connection surfaces S1 and S2 to be at least partially electrically exposed.

As illustrated in FIG. 1 and FIG. 2, the package 100 further includes an EMI shield 124 that is disposed adjacent to the exterior surfaces of the package body 114, the connection surfaces S1 and S2 of the grounding elements 118a and 118b, and the lateral surfaces 142 and 144 of the substrate unit 102. The EMI shield 124 is formed from an electrically conductive material, and substantially surrounds the semiconductor devices 108a, 108b, and 108c within the package 100 to provide protection against EMI. In the illustrated embodiment, the EMI shield 124 includes an upper portion 126 and a lateral portion 128b, which extends around substantially the entire periphery of the package body 114 and defines the orthogonal lateral profile of the package 100. As illustrated in FIG. 2, the lateral portion 128 extends downwardly from the upper portion 126 and along the lateral surfaces 142 and 144 of the substrate unit 102, and includes a lower end that is substantially aligned or co-planar with the lower surface 106 of the substrate unit 102. However, it is contemplated that the extent of the lateral portion 128 and the alignment of its lower end with the lower surface 106 can be varied for other implementations.

As illustrated in FIG. 2, the EMI shield 124 is electrically connected to the connection surfaces S1 and S2 of the grounding elements 118a and 118b. When electromagnetic emissions radiated from an interior of the package 100 strike the EMI shield 124, at least a portion of these emissions can be efficiently grounded via the grounding elements 118a and 118b, thereby reducing the level of emissions that can pass through the EMI shield 124 and adversely affect neighboring semiconductor devices. Similarly, when electromagnetic emissions from a neighboring semiconductor device strike the EMI shield 124, a similar grounding can occur to reduce EMI of the semiconductor devices 108a, 108b, and 108c within the package 100. During operation, the package 100 can be disposed on a printed circuit board ("PCB") and electrically connected to the PCB via the electrical contacts 110a, 1110b, and 110c. As previously described, at least one of the electrical contacts 110a, 110b, and 110c is a ground electrical contact, and the ground electrical contact can be electrically connected to a ground voltage provided by the PCB. Grounding of electromagnetic emissions incident upon the EMI shield 124 can occur through an electrical pathway including the grounding elements 118a and 118b, the grounding pads 146a and 146b and other electrical interconnect included in the substrate unit 102, and the ground electrical contact. Because the lower end of the EMI shield 124 is substantially aligned with the lower surface 106 of the substrate unit 102, the lower end also can be electrically connected to a ground voltage provided by the PUB, thereby providing an alternative electrical pathway for grounding undesired electromagnetic emissions.

In the illustrated embodiment, the EMI shield 124 is a conformal shield that is formed as a set of layers or films. Advantageously, the EMI shield 124 can be formed adjacent to and in direct contact with an exterior of the package 100 without the use of an adhesive, thereby enhancing reliability and resistance to temperature, humidity, and other environmental conditions. Also, the conformal characteristics of the EMI shield 124 allow similar EMI shields and similar manufacturing operations to be readily applied to semiconductor device packages of different sizes and shapes, thereby reducing manufacturing cost and time to accommodate the different packages. For certain implementations, a thickness of the EMI shield 124 can be in the range of about 1 μm to about 500 μm, such as from about 1 μm to about 100 μm, from about 1 μm to about 50 μm, or from about 1 μm to about 10 μm. Such reduced thickness of the EMI shield 124, relative to a typical casing, allows a reduced overall package size, and is a further advantage of the illustrated embodiment.

Figure 3:
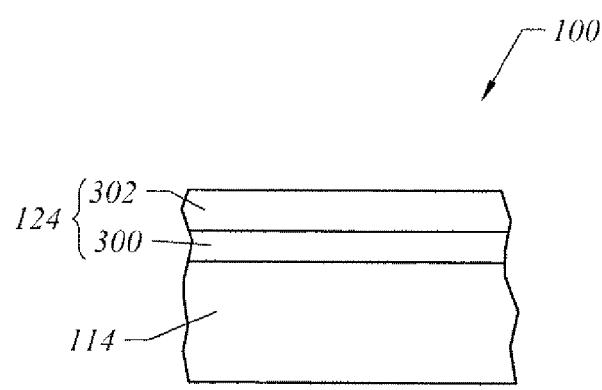
FIG. 3 illustrates an enlarged, cross-sectional view of a portion of the semiconductor device package of FIG. 1.

Attention next turns to FIG. 3, which illustrates an enlarged, cross-sectional view of a portion of the package 100 of FIG. 1 and FIG. 2. In particular, FIG. 3 illustrates a particular implementation of the EMI shield 124 that is disposed adjacent to the package body 114.

As illustrated in FIG. 3, the EMI shield 124 is multi-layered and includes an inner layer 300, which is disposed adjacent to the package body 114, and an outer layer 302, which is disposed adjacent to the inner layer 300 and is exposed at the exterior of the package 100. In general, each of the inner layer 300 and the outer layer 302 can be formed from a metal, a metal alloy, a matrix with a metal or a metal alloy dispersed therein, or another suitable electrically conductive material. For example, each of the inner layer 300 and the outer layer 302 can be formed from aluminum, copper, chromium, tin, gold, silver, nickel, stainless steel, or a combination thereof. The inner layer 300 and the outer layer 302 can be formed from the same electrically conductive material or different electrically conductive materials. For example, a metal, such as nickel, can be selected for both the inner layer 300 and the outer layer 302. In some instances, different electrically conductive materials can be selected for the inner layer 300 and the outer layer 302 to provide complementary functionalities. For example, a metal with a higher electrical conductivity, such as aluminum, copper, gold, or silver, can be selected for the inner layer 300 to provide EMI shielding functionality. On the other hand, a metal with a somewhat lower electrical conductivity, such as nickel, can be selected for the outer layer 302 to protect the inner layer 300 against oxidation, humidity, and other environmental conditions. In this case, the outer layer 302 also can contribute to the EMI shielding functionality, while providing the protection functionality. While two layers are illustrated in FIG. 3, it is contemplated that more or less layers can be included for other implementations.

Figure 4:
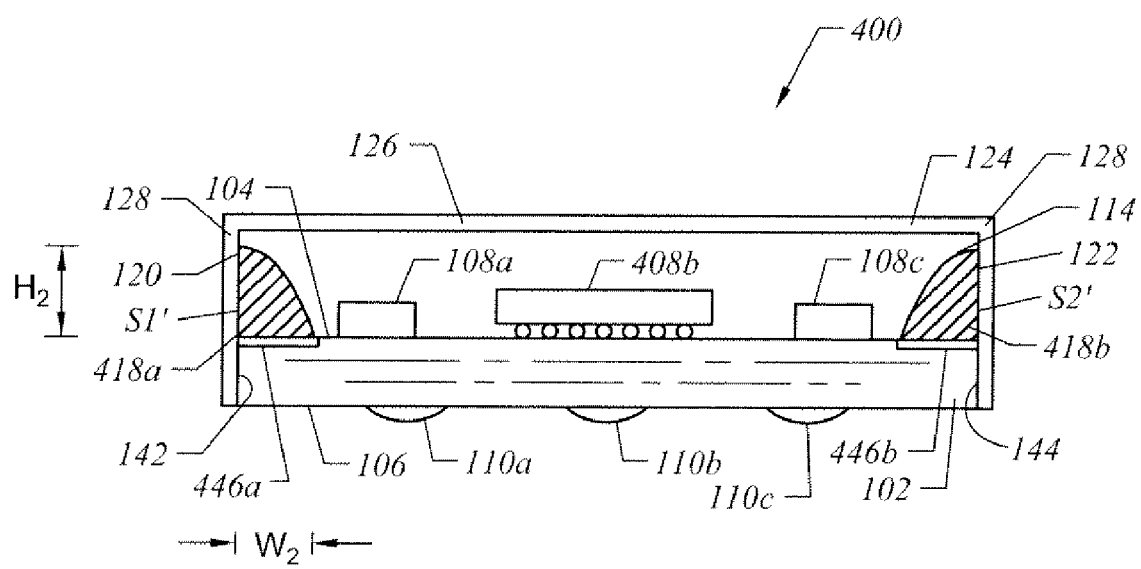
FIG. 4 illustrates a cross-sectional view of a semiconductor device package implemented in accordance with another embodiment of the invention.

FIG. 4 illustrates a cross-sectional view of a semiconductor device package 400 implemented in accordance with another embodiment of the invention. Certain aspects of the package 400 are implemented in a similar manner as previously described for the package 100 of FIG. 1 through FIG. 3 and, thus, are not further described herein.

Referring to FIG. 4, the package 400 includes grounding elements 418a and 418b, which are electrically connected to and extend upwardly from respective ones of grounding pads 446a and 446b. The grounding elements 418a and 418b include connection surfaces S1' and S2', respectively, which are lateral surfaces that face away from an interior of the package 400 and are electrically exposed at a periphery of the substrate unit 102. For certain implementations, a height $H_2$ of the grounding elements 418a and 418b can be in the range of about 400 μm to about 1,200 μm, such as from about 500 μm to about 1,100 μm or from about 600 μm to about 1,000 μm, and a width $W_2$ of the grounding elements 418a and 418b can be in the range of about 200 μm to about 600 μm such as from about 250 μm to about 550 μm or from about 300 μm to about 500 μm. An area of each of the connection surfaces S1' and S2' can be in the range of about 0.1 $mm^2$ to about 1.1 $mm^2$, such as from about 0.2 $mm^2$ to about 0.95 $mm^2$ or from about 0.3 $mm^2$ to about 0.8 $mm^2$. Advantageously, the relatively large areas of the connection surfaces S1 and S2', relative to those described in connection with FIG. 2, can further enhance reliability and efficiency of electrical connections for reducing EMI.

As illustrated in FIG. 4, the package 400 also includes a semiconductor device 408b, which is a semiconductor chip that is disposed adjacent to the upper surface 104 of the substrate unit 102. In the illustrated embodiment, the semiconductor device 408b is flip chip-bonded to the substrate unit 102, such as via a set of solder bumps. It is contemplated that the semiconductor device 408b can be electrically connected to the substrate unit 102 in another manner, such as by wire-bonding.

FIG. 5A through FIG. 5G illustrate a method of forming a semiconductor device package, according to an embodiment of the invention. For case of presentation, the following manufacturing operations are described with reference to the package 100 of FIG. 1 through FIG. 3. However, it is contemplated that the manufacturing operations can be similarly carried out to form other semiconductor device packages.

Figure 5C:
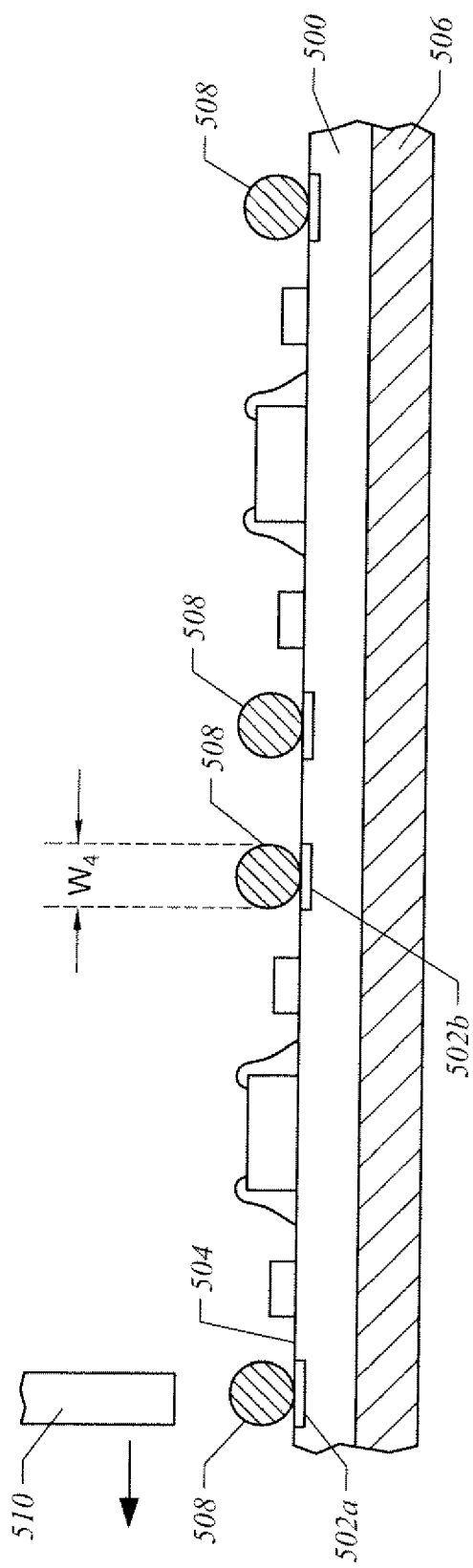
Figure 5D:
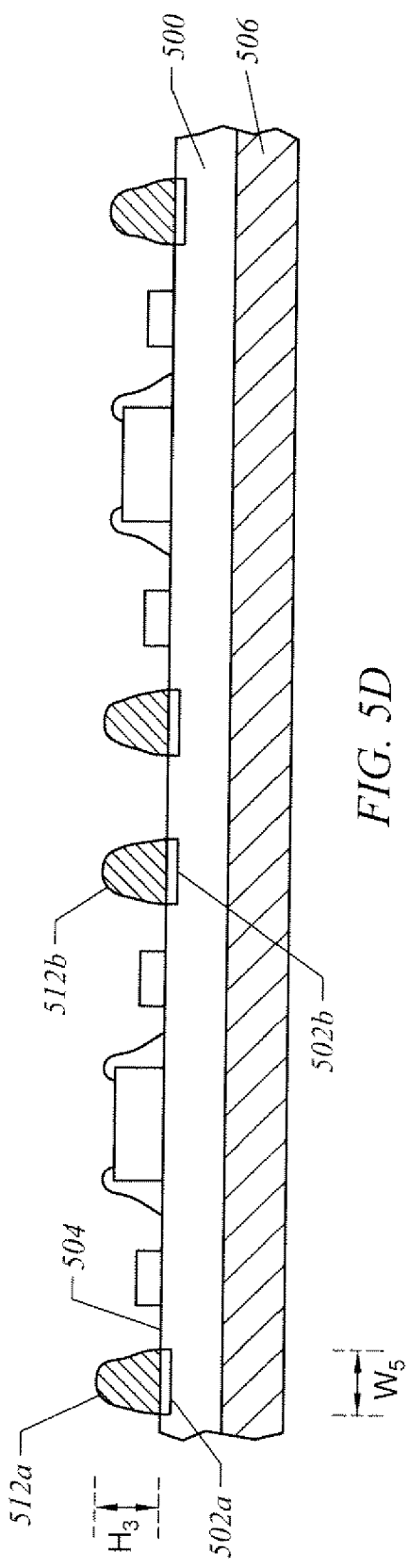

Referring first to FIG. 5A and FIG. 5D, a substrate 500 is provided. To enhance manufacturing throughput, the substrate 500 includes multiple substrate units, including the substrate unit 102 and an adjacent substrate unit 102', thereby allowing certain of the manufacturing operations to be readily performed in parallel or sequentially. The substrate 500 can be implemented in a strip manner, in which the multiple substrate units are arranged sequentially in a linear fashion, or in an array manner, in which the multiple substrate units are arranged in a two-dimensional fashion. For ease of presentation, the following manufacturing operations are primarily described with reference to the substrate unit 102 and related components, although the manufacturing operations can be similarly carried for other substrate units and related components.

As illustrated in FIG. 5A and FIG. 5B, multiple contact pads are disposed adjacent to a periphery of each substrate unit. In particular, contact pads 502a, 502b, 502c, 502d, and 502e are disposed adjacent to sides of the substrate unit 102. In the illustrated embodiment, conductive bumps are subsequently disposed adjacent to respective ones of the contact pads 502a, 502b, 502c, 502d, and 502e, which serve to electrically connect the conductive bumps to other electrical interconnect included in the substrate 500. The contact pads 502a, 502b, 502c, 502d, and 502c can be formed in any of a number of ways, such as photolithography, chemical etching, laser drilling, or mechanical drilling to form openings, along with plating of the openings using a metal, a metal alloy, a matrix with a metal or a metal alloy dispersed therein, or another suitable electrically conductive material.

In the illustrated embodiment, a periphery of a contact pad, such as the contact pad 502a or 502b, has a substantially circular shape. It is contemplated that the shape of a contact pad, in general, can be any of a number of shapes, such as a substantially elliptical shape, a substantially square shape, a substantially rectangular shape, or a substantially annular shape. It is also contemplated that a periphery of a contact pad can be roughly textured. For certain implementations, a lateral extent $W_3$ of each contact pad (also sometimes referred to as a contact pad size) can be in the range of about 250 µm to about 650 µm, such as from about 300 µm to about 600 µm or from about 350 µm to about 550 µm. For other implementations (such as further described below with reference to FIG. 6), the lateral extent $W_3$ of each contact pad can be in the range of about 450 µm to about 1,250 µm, such as from about 550 µm to about 1,150 µm or from about 650 µm to about 1,050 µm. If a contact pad has a non-uniform shape, the lateral extent $W_3$ can correspond to, for example, an average of lateral extents along orthogonal directions.

To enhance reliability and efficiency of electrical connections for reducing EMI, contact pads are disposed adjacent to all four sides of each substrate unit, although the contact pads also can be disposed adjacent to a subset of the four sides. It is also contemplated that contact pads can be disposed adjacent to all four corners of each substrate unit or a subset of the four corners. For certain implementations, a spacing $L_1$ of nearest-neighbor contact pads of a substrate unit (also sometimes referred to as a contact pad pitch) can be in the range of about 0.1 mm to about 3 mm, such as from about 0.2 mm to about 2 mm or from about 0.5 mm to about 1.5 mm. Referring to FIG. 5B, a dashed boundary within each substrate unit defines a "keep-out" portion, within which semiconductor devices are disposed. To reduce or minimize adverse impact on the operation of semiconductor devices, contact pads of a substrate unit can be spaced apart from the "keep-out" portion by a spacing $L_2$ (also sometimes referred to as a "keep-out" distance). For certain implementations, the spacing $L_2$ can be in the range of about 50 µm to about 300 µm, such as from about 50 µm to about 200 µm or from about 100 µm to about 150 µm. It is contemplated that the number of contact pads and their positioning within the substrate 500 can vary from that illustrated in FIG. 5A and FIG. 5B. It is also contemplated that multiple rows of contact pads can be disposed adjacent to a periphery of each substrate unit.

Once the substrate 500 is provided, the semiconductor devices 108a, 108b, and 108c are disposed adjacent to an upper surface 504 of the substrate 500, and are electrically connected to the substrate unit 102. In particular, the semiconductor device 108h is wire-bonded to the substrate unit 1021 via the wires 112, and the semiconductor devices 108a and 108c are surface mounted to the substrate unit 102. Referring to FIG. 5A, a lower surface 574 of the substrate 500 is disposed adjacent to a tape 506, which can be implemented as a single-sided or double-sided adhesive tape. Advantageously, the tape 506 secures the substrate 500 and related components, and allows various subsequent operations to be carried out adjacent to the tape 506, without requiring inversion or transfer to a separate carrier.

Next, as illustrated in FIG. 5C, an electrically conductive material SOS is applied to the upper surface 504 of the substrate 500 and disposed adjacent to contact pads, including the contact pads 502a and 502b. The electrically conductive material 508 includes a metal, a metal alloy, a matrix with a metal or a metal alloy dispersed therein, or another suitable electrically conductive material. For example, the electrically conductive material 508 can include a solder, which can be formed from any of a number of fusible metal alloys having melting points in the range of about 90° C. to about 450° C. Examples of such fusible metal alloys include tin-lead alloys, copper-zinc alloys, copper-silver alloys, tin-silver-copper alloys, bismuth-containing alloys, indium-containing alloys, and antimony-containing alloys. As another example, the electrically conductive material 508 can include an electrically conductive adhesive, which can be formed from any of a number of resins having an electrically conductive filler dispersed therein. Examples of suitable resins include epoxy-based resins and silicone-based resins, and examples of suitable fillers include silver fillers and carbon fillers.

In the illustrated embodiment, a dispenser 510 is laterally positioned with respect to the substrate 500 and is used to apply the electrically conductive material 508. In particular, the dispenser 510 is substantially aligned with the contact pads 502a and 502b, thereby allowing the electrically conductive material 508 to be selectively applied to the contact pads 502a and 502b. While a single dispenser is illustrated in FIG. 5C, it is contemplated that multiple dispensers can be used to further enhance manufacturing throughput. Still referring to FIG. 5C, the dispenser 510 applies the electrically conductive material 508 in the form of conductive balls each having a substantially spherical or substantially spheroidal shape, although it is contemplated that the shapes of the conductive balls can vary for other implementations. For certain implementations, a lateral extent $W_4$ of each conductive ball (also sometimes referred to as a conductive ball size) can be in the range of about 200 µm to about 600 µm, such as from about 250 µm to about 550 µm or from about 300 µm to about 500 µm. For other implementations (such as further described below with reference to FIG. 6), the lateral extent $W_4$ of each conductive ball can be in the range of about 400 µm to about 1,200 µm, such as from about 500 µm to about 1,100 µm or from about 600 µm to about 1,000 µm. If a conductive ball has a non-uniform shape, the lateral extent $W_4$ can correspond to, for example, an average of lateral extents along orthogonal directions.

Once applied, the electrically conductive material 508 is reflowed, such as by raising the temperature to near or above a melting point of the electrically conductive material 508. As a result of gravity and other effects, the electrically conductive material 508 is drawn downwardly towards the contact pads 502a and 502b, as illustrated in FIG. 5D, thereby enhancing reliability and efficiency of electrical connections with the contact pads 502a and 502b. Once the electrically conductive material 508 is sufficiently reflowed, the electrically conductive material 508 is hardened or solidified, such as by lowering the temperature to below the melting point of the electrically conductive material 508. This solidification operation forms conductive bumps 512a and 512b disposed adjacent to respective ones of the contact pads 502a and 502b. In the illustrated embodiment, the conductive bumps 512a and 512b are elongated structures that extend upwardly from the upper surface 504 of the substrate 500, although it is contemplated that the shapes of the conductive bumps 512a and 512b can vary for other implementations. For certain implementations, a height $H_3$ of the conductive bumps 512a and 512b can be in the range of about 200 μm to about 600 μm, such as from about 250 μm to about 550 μm or from about 300 μm to about 500 μm, and a width $W_5$ of the conductive bumps 512a and 512b also can be in the range of about 200 μm to about 600 μm, such as from about 250 μm to about 550 μm or from about 300 μm to about 500 μm. For other implementations (such as further described below with reference to FIG. 6), the height $H_3$ of the conductive bumps 512a and 512b can be in the range of about 400 μm to about 1,200 μm, such as from about 500 μm to about 1,100 μm or from about 600 μm to about 1,000 μm, and the width $W_5$ of the conductive bumps 512a and 512b also can be in the range of about 400 μm to about 1,200 μm, such as from about 500 μm to about 1,100 μm or from about 600 μm to about 1,000 μm.

Figure 5E:
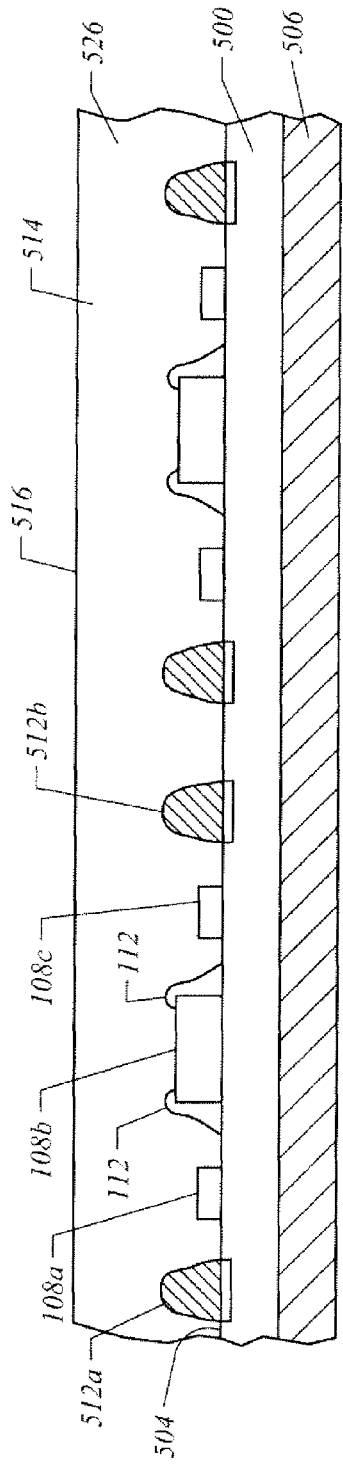

Referring next to FIG. 5E, a molding material 514 is applied to the upper surface 504 of the substrate 500 so as to substantially cover or encapsulate the conductive bumps 512a and 512b, the semiconductor devices 108a, 108b, and 108c, and the wires 112. The molding material 514 can include, for example, a Novolac-based resin, an epoxy-based resin, a silicone-based resin, or another suitable encapsulant. Suitable fillers also can be included, such as powdered $SiO_2$. The molding material 514 can be applied using any of a number of molding techniques such as compression molding, injection molding, and transfer molding. Once applied, the molding material 514 is hardened or solidified, such as by lowering the temperature to below a melting point of the molding material 514, thereby forming a molded structure 526. To facilitate proper positioning of the substrate 500 during subsequent singulation operations, fiducial marks can be formed in the molded structure 526, such as using laser marking. Alternatively, or in conjunction, fiducial marks can be formed adjacent to a periphery of the substrate 500.

Figure 5F:
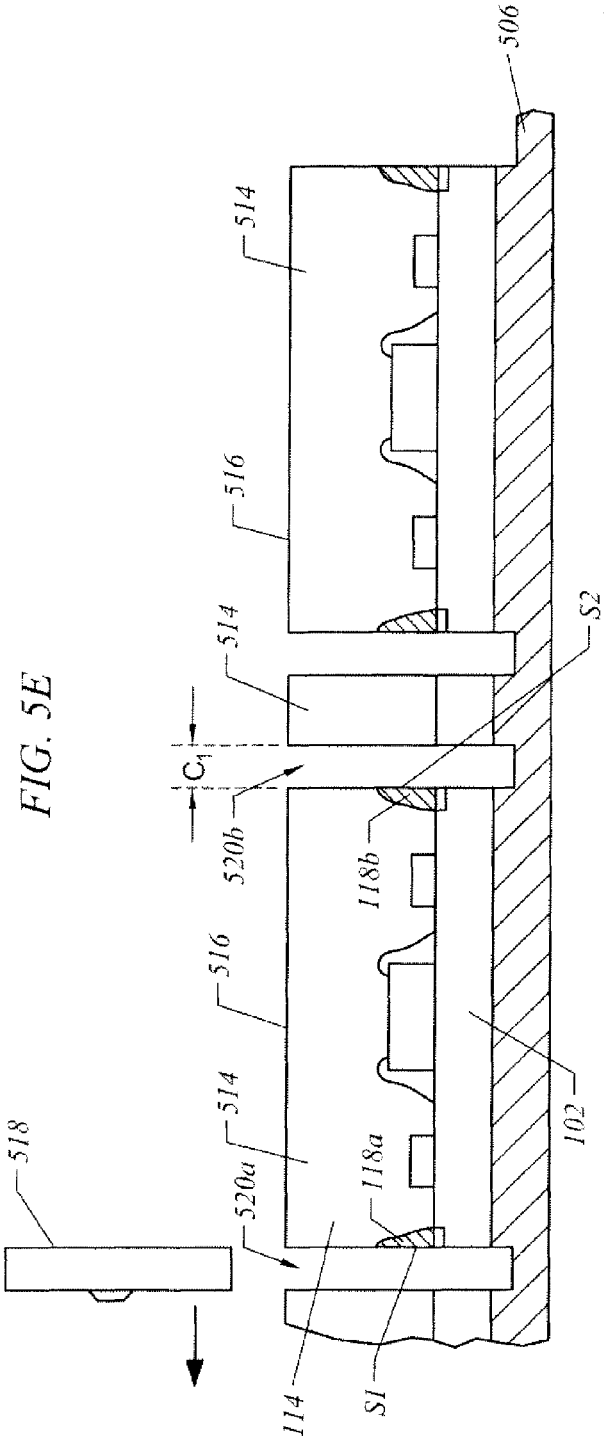
Figure 5G:
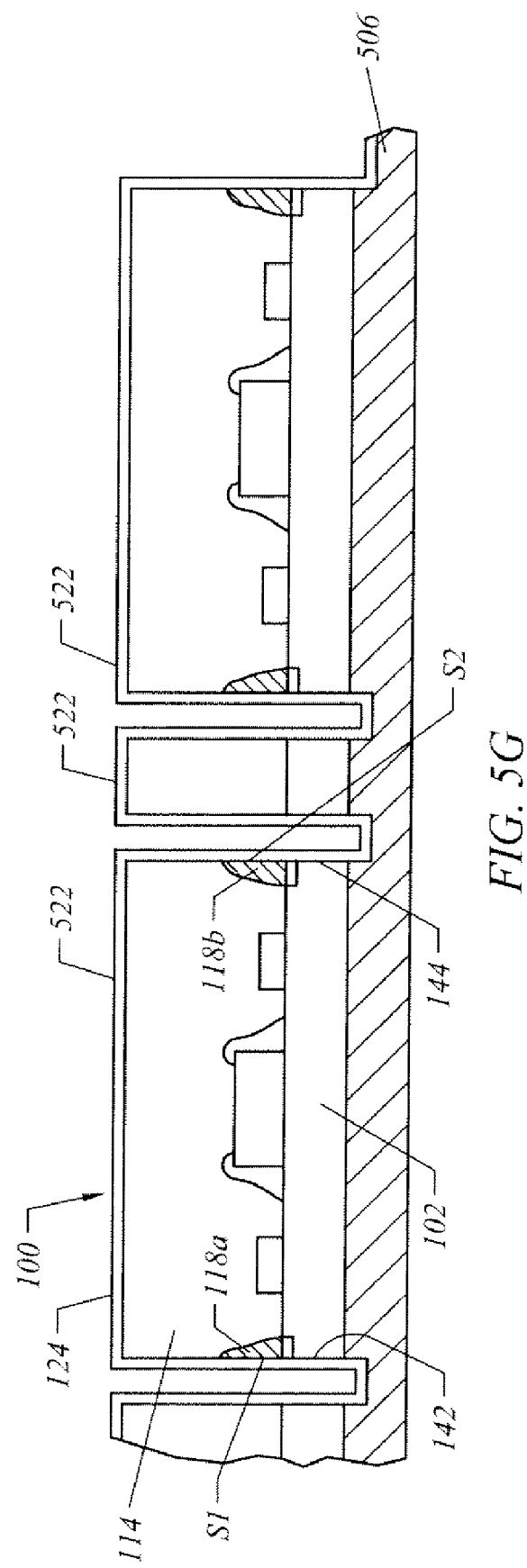

Singulation is next carried out with respect to an upper surface 516 of the molded structure 526. Such manner of singulation can be referred to as "front-side" singulation. Referring to FIG. 5E and FIG. 5F, the "front-side" singulation is carried out using a saw 518, which forms cutting slits, including cutting slits 520a and 520b. In particular, the cutting slits 520a and 520b extend downwardly and completely through the molded structure 526 and the substrate 500 and partially through the tape 506, thereby sub-dividing the molded structure 526 and the substrate 500 into discrete units, including the package body 114 and the substrate unit 102. Such manner of singulation can be referred to as "full-cut" singulation, since sub-division of the molded structure 526 and the substrate 500 at each of various locations can occur through one singulation operation, rather than multiple singulation operations, such as multiple "half-cut" singulations. Advantageously, the use of "full-cut" singulation, rather than "half-cut" singulation, enhances manufacturing throughput by reducing the number of singulation operations and the time involved for those operations. Also, manufacturing cost is reduced by enhancing an utilization ratio of the substrate 500, and an overall yield rate is enhanced by reducing the probability of defects resulting from sawing errors. As illustrated in FIG. 5F, the tape 506 secures the substrate unit 102 and the package body 114 with respect to adjacent substrate units and package bodies during the "full-cut" singulation.

Still referring to FIG. 5F, the saw 518 is laterally positioned and substantially aligned with each conductive bump, such that a resulting cutting slit removes a certain volume or weight percentage of the conductive bump, such as from about 10 percent to about 90 percent, from about 30 percent to about 70 percent, or from about 40 percent to about 60 percent by volume or by weight. In such manner, the grounding elements 118a and 118b are formed and include the connection surfaces S1 and S2, respectively, which are exposed to the surroundings at the periphery of the substrate unit 102. The alignment of the saw 518 during singulation can be aided by fiducial marks, which allow proper positioning of the saw 518 when forming the cutting slits 520a and 520b. For certain implementations, a width $C_1$ of each of the cutting slits 520a and 520b (also sometimes referred to as a full-cut width or full-cut sawing street) can be in the range of about 100 μm to about 600 μm, such as from about 200 μm to about 400 μm or from about 250 μm to about 350 μm.

Next, as illustrated in FIG. 5C, an EMI coating 522 is formed adjacent to exposed surfaces, including the exterior surfaces of the package body 114, the connection surfaces S1 and S2 of the grounding elements 118a and 118b, and the lateral surfaces 142 and 144 of the substrate unit 102. The EMI coating 522 can be formed using any of a number of coating techniques, such as chemical vapor deposition, electroless plating, electrolytic plating, printing, spraying, sputtering, and vacuum deposition. For example, the EMI coating 522 can include a single layer that is formed from nickel using electroless plating and with a thickness of at least about 5 μm, such as from about 5 μm to about 50 μm or from about 5 μm to about 10 μm. If the EMI coating 522 is multi-layered, different layers can be formed using the same coating technique or different coating techniques. For example, an inner layer can be formed from copper using electroless plating, and an outer layer can be formed from nickel using either electroless plating or electrolytic plating. As another example, an inner layer (serving as a base layer) can be formed from copper using either sputtering or electroless plating and with a thickness of at least about 1 μm, such as from about 1 μm to about 50 μm or from about 1 μm to about 10 μm, and an outer layer (serving as an anti-oxidation layer) can be formed from stainless steel, nickel, or copper using sputtering and with a thickness no greater than about 1 μm, such as from about 0.01 μm to about 1 μm or from about 0.01 μm to about 0.1 μm. In these examples, surfaces to which the EMI coating 522 is applied can be subjected to certain pre-treatment operations to facilitate formation of the inner layer and the outer layer. Examples of such pre-treatment operations include surface roughening, such as by chemical etching or mechanical abrasion, and formation of a seed layer. Separating the substrate unit 102 and related components from the tape 506, such as using a pick-and-place technique, results in the package 100 including the EMI shield 124.

Figure 6:
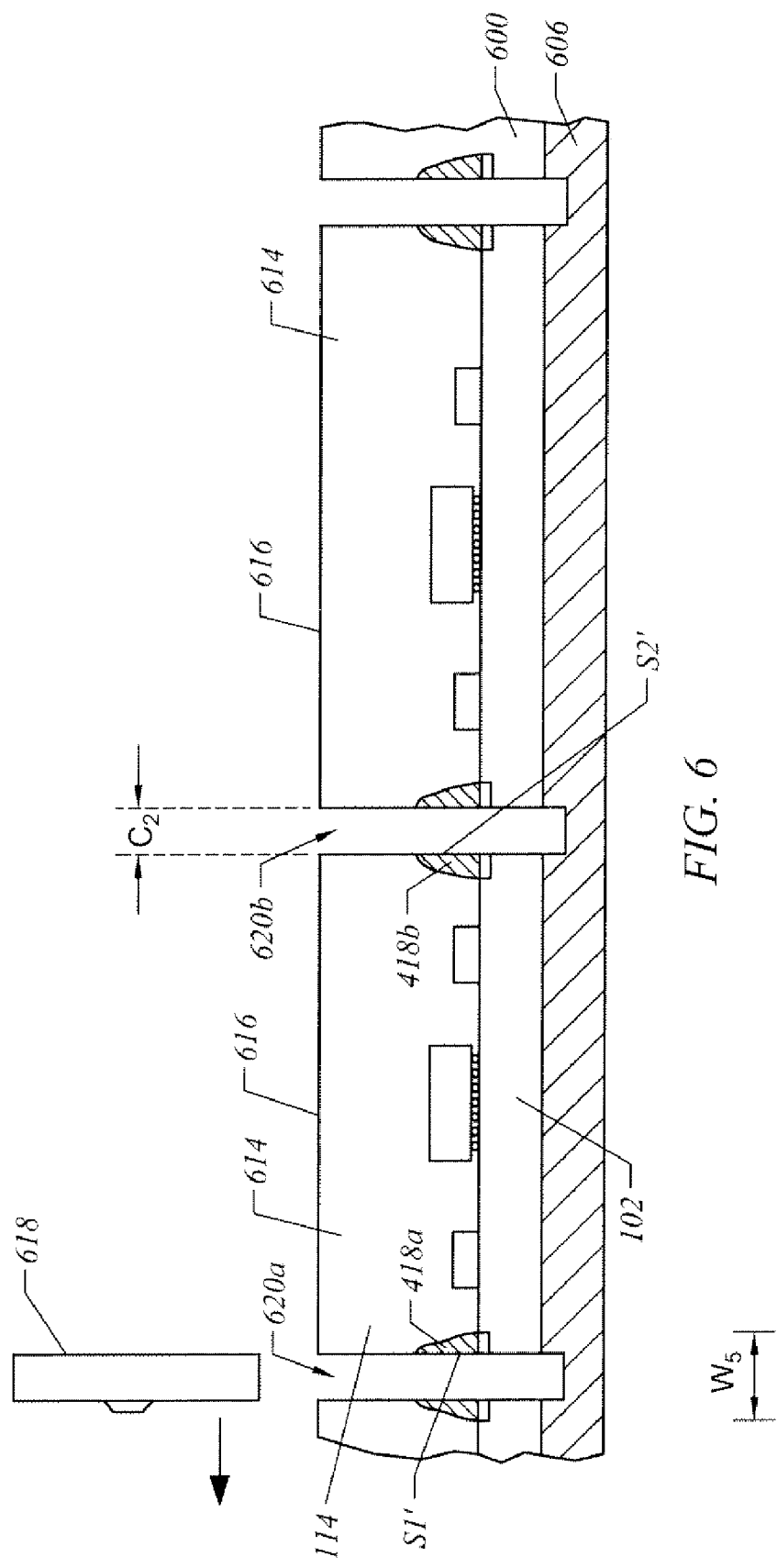
FIG. 6 illustrates a method of forming the semiconductor device package of FIG. 4, according to another embodiment of the invention.

FIG. 6 illustrates a method of forming a semiconductor device package, according to another embodiment of the invention. For ease of presentation, the following manufacturing operations are described with reference to the package 400 of FIG. 4. However, it is contemplated that the manufacturing operations can be similarly carried out to form other semiconductor device packages. Also, certain aspects of the manufacturing operations are implemented in a similar manner as previously described for FIG. 5A through FIG. 5C and, thus, are not further described herein.

Referring to FIG. 6, a substrate 600 along with a hardened molding material 614 are disposed adjacent to a tape 606, which can be implemented as a single-sided or double-sided adhesive tape. Singulation is next carried out with respect to an upper surface 616 of the hardened molding material 614. As illustrated in FIG. 6, the singulation is carried out using a saw 618, which forms cutting slits 620a and 620b that extend downwardly and completely through the hardened molding material 614 and the substrate 600 and partially through the tape 606, thereby sub-dividing the hardened molding material 614 and the substrate 600 into discrete units, including the package body 114 and the substrate unit 102. In particular, the saw 618 is laterally positioned and substantially aligned with each conductive bump, such that a resulting cutting slit sub-divides the conductive bump into two grounding elements that are separated from one another and are disposed adjacent to respective substrate units. In such manner, the grounding elements 418a and 418b are formed and include the connection surfaces S1' and S2' respectively, which are exposed to the surroundings at the periphery of the substrate unit 102. Advantageously, the manner of singulation illustrated in FIG. 6 enhances manufacturing throughput by further reducing the number of singulation operations and the time involved for those operations, reduces manufacturing cost by further enhancing an utilization ratio of the substrate 600, and enhances an overall yield rate by further reducing the probability of defects resulting from sawing errors. For certain implementations, a width $C_2$ of each of the cutting slits 620a and 620b can be substantially the same as the width $C_1$ previously described above with reference to FIG. 5F, and can be in the range of about 100 μm to about 600 μm, such as from about 200 μm to about 400 μm or from about 250 μm to about 350 μm). However, it is contemplated that the width $C_2$ can vary for other implementations, and can be adjusted relative to the width $W_5$ of a conductive bump to allow its sub-division into multiple grounding elements. For example, the width $C_2$, in general, can be represented as: $C_2 < W_5$.

While the invention has been described with reference to the specific embodiments thereof it should be understood by those skilled in the art that various changes may be made and equivalents may be substituted without departing from the true spirit and scope of the invention as defined by the appended claims. In addition, many modifications may be made to adapt a particular situation, material, composition of matter, method, or process to the objective, spirit and scope of the invention. All such modifications are intended to be within the scope of the claims appended hereto. In particular, while the methods disclosed herein have been described with reference to particular operations performed in a particular order, it will be understood that these operations may be combined, sub-divided, or re-ordered to form an equivalent method without departing from the teachings of the invention. Accordingly, unless specifically indicated herein, the order and grouping of the operations are not limitations of the invention.

What is claimed is:

1. A semiconductor device package, comprising:
    a substrate unit including an upper surface, a lower surface, and a lateral surface disposed adjacent to a periphery of the substrate unit;
    a grounding element disposed adjacent to the periphery of the substrate unit and extending upwardly from the upper surface of the substrate unit, the grounding element corresponding to a remnant of a conductive bump and including a lateral surface;
    a semiconductor device disposed adjacent to the upper surface of the substrate unit and electrically connected to the substrate unit;
    a package body disposed adjacent to the upper surface of the substrate unit and covering the semiconductor device and the grounding element, such that the lateral surface of the grounding element is electrically exposed, the package body including exterior surfaces that include a lateral surface, the lateral surface of the package body being substantially aligned with the lateral surface of the substrate unit; and
    an electromagnetic interference shield disposed adjacent to the exterior surfaces of the package body and electrically connected to the lateral surface of the grounding element,
    wherein the grounding element provides an electrical pathway to ground electromagnetic emissions incident upon the electromagnetic interference shield.

2. The semiconductor device package of claim 1, wherein the lateral surface of the grounding element is substantially aligned with the lateral surface of the substrate unit.

3. The semiconductor device package of claim 1, wherein the lateral surface of the grounding element is substantially planar and has a substantially orthogonal orientation with respect to the upper surface of the substrate unit.

4. The semiconductor device package of claim 1, wherein the electromagnetic interference shield includes a lateral portion that extends along the lateral surface of the substrate unit.

5. The semiconductor device package of claim 4, wherein a lower end of the lateral portion is substantially co-planar with the lower surface of the substrate unit.

6. The semiconductor device package of claim 5, wherein a height of the grounding element is in the range of 200 μm to 600 μm, and a width of the grounding element is in the range of 100 μm to 300 μm.

7. The semiconductor device package of claim 5, wherein a height of the grounding element is in the range of 400 μm to 1,200 μm, and a width of the grounding element is in the range of 200 μm to 600 μm.

8. A semiconductor device package, comprising:
    a substrate unit including a first surface, a second opposing surface, and a grounding pad disposed adjacent to the first surface;
    a grounding element extending upwardly from the grounding pad and electrically connected to the grounding pad, the grounding element including a connection surface disposed adjacent to a periphery of the substrate unit;
    a semiconductor device disposed adjacent to the first surface of the substrate unit and electrically connected to the substrate unit;
    a package body disposed adjacent to the first surface of the substrate unit and covering the semiconductor device and the grounding element, such that the connection surface of the grounding element is electrically exposed, the package body including exterior surfaces; and
    an electromagnetic interference shield disposed adjacent to the exterior surfaces of the package body and electrically connected to the connection surface of the grounding element,
    wherein the grounding element provides an electrical pathway to ground electromagnetic emissions incident upon the electromagnetic interference shield.

9. The semiconductor device package of claim 8, wherein a lateral profile of the semiconductor device package is substantially planar and is substantially orthogonal with respect to the first surface of the substrate unit.

10. The semiconductor device package of claim 8, wherein the grounding element includes at least one of a solder and an electrically conductive adhesive.

11. The semiconductor device package of claim 8, wherein the grounding pad corresponds to a remnant of a contact pad, and the grounding element corresponds to a remnant of a conductive bump.

12. The semiconductor device package of claim 10, wherein an area of the connection surface is in the range of 0.03 mm² to 0.3 mm².

13. The semiconductor device package of claim 10, wherein an area of the connection surface is in the range of 0.1 mm² to 1.1 mm².

14. The semiconductor device package of claim 8, wherein the substrate unit further includes a lateral surface extending between the first surface and the second opposing surface, and the connection surface of the grounding element is substantially co-planar aligned with the lateral surface of the substrate unit.

15. The semiconductor device package of claim 14, wherein the exterior surfaces of the package body include a lateral surface, and the lateral surface of the package body is substantially co-planar with the lateral surface of the substrate unit.

16. The semiconductor device package of claim 10, wherein the electromagnetic interference shield is a conformal shield that includes at least one of aluminum, copper, chromium, tin, gold, silver, stainless steel, and nickel.

17. The semiconductor device package of claim 10, wherein the electromagnetic interference shield includes a first layer and a second layer disposed adjacent to the first layer.

18. The semiconductor device package of claim 17, wherein the first layer and the second layer include different electrically conductive materials.

19. The semiconductor device package of claim 10, wherein a thickness of the electromagnetic interference shield is in the range of 1 µm to 50 µm.

20. A semiconductor device package, comprising:
a substrate unit including an upper surface, a lower surface, and a lateral surface disposed adjacent to a periphery of the substrate unit;
a conductive bump disposed adjacent to the periphery of the substrate unit and extending upwardly from the upper surface of the substrate unit, the conductive bump including a lateral surface;
a semiconductor device disposed adjacent to the upper surface of the substrate unit and electrically connected to the substrate unit;
a package body disposed adjacent to the upper surface of the substrate unit and covering the semiconductor device and the conductive bump, the package body including exterior surfaces that include a lateral surface, the lateral surface of the package body being substantially co-planar with the lateral surface of the conductive bump; and
a conformal shield disposed adjacent to the exterior surfaces of the package body and electrically connected to the lateral surface of the conductive bump.

21. The semiconductor device package of claim 20, wherein the lateral surface of the conductive bump is substantially co-planar with the lateral surface of the substrate unit.

* * * * *